(12) United States Patent
Lai et al.

(10) Patent No.: US 10,163,632 B2
(45) Date of Patent: *Dec. 25, 2018

(54) MATERIAL COMPOSITION AND PROCESS FOR SUBSTRATE MODIFICATION

(71) Applicant: Taiwan Semiconductor Manufacturing Co., Ltd., Hsin-Chu (TW)

(72) Inventors: Wei-Han Lai, New Taipei (TW); Chien-Wei Wang, Hsinchu County (TW); Ching-Yu Chang, Yilang County (TW); Chin-Hsiang Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 48 days.

This patent is subject to a terminal disclaimer.

(21) Appl. No.: 15/380,911

(22) Filed: Dec. 15, 2016

(65) Prior Publication Data

US 2018/0174837 A1 Jun. 21, 2018

(51) Int. Cl.
| H01L 21/033 | (2006.01) |
| H01L 21/027 | (2006.01) |
| H01L 21/02 | (2006.01) |
| G03F 7/16 | (2006.01) |
| G03F 7/11 | (2006.01) |
| G03F 7/20 | (2006.01) |

(52) U.S. Cl.
CPC ............ *H01L 21/0332* (2013.01); *G03F 7/11* (2013.01); *G03F 7/162* (2013.01); *G03F 7/2004* (2013.01); *H01L 21/0274* (2013.01); *H01L 21/02115* (2013.01); *H01L 21/02282* (2013.01); *H01L 21/0337* (2013.01)

(58) Field of Classification Search
CPC ... G03F 7/11; H01L 21/0332; H01L 21/02115
See application file for complete search history.

(56) References Cited

U.S. PATENT DOCUMENTS

| 8,216,767 | B2 | 7/2012 | Wang et al. |
| 8,323,870 | B2 | 12/2012 | Lee et al. |
| 8,580,117 | B2 | 11/2013 | Kao et al. |
| 8,658,344 | B2 | 2/2014 | Wang et al. |
| 8,715,919 | B2 | 5/2014 | Chang et al. |
| 8,741,551 | B2 | 6/2014 | Wu et al. |
| 2013/0323641 | A1 | 12/2013 | Chang |
| 2014/0011133 | A1 | 1/2014 | Liu et al. |

(Continued)

*Primary Examiner* — Kathleen Duda
(74) *Attorney, Agent, or Firm* — Haynes And Boone, LLP

(57) ABSTRACT

Provided is a material composition and method for substrate modification. A substrate is patterned to include a plurality of features. The plurality of features includes a first subset of features having one or more substantially inert surfaces. In various embodiments, a priming material is deposited over the substrate, over the plurality of features, and over the one or more substantially inert surfaces. By way of example, the deposited priming material bonds at least to the one or more substantially inert surfaces. Additionally, the deposited priming material provides a modified substrate surface. After depositing the priming material, a layer is spin-coated over the modified substrate surface, where the spin-coated layer is substantially planar.

20 Claims, 11 Drawing Sheets

(56) References Cited

U.S. PATENT DOCUMENTS

| | | |
|---|---|---|
| 2014/0017615 A1 | 1/2014 | Chang |
| 2014/0017616 A1 | 1/2014 | Chang |
| 2014/0065843 A1 | 3/2014 | Chang et al. |
| 2014/0117563 A1 | 5/2014 | Yu et al. |
| 2014/0120459 A1 | 5/2014 | Liu et al. |
| 2014/0186773 A1 | 7/2014 | Chang |
| 2014/0255850 A1 | 9/2014 | Chang et al. |
| 2014/0272709 A1 | 9/2014 | Liu et al. |
| 2014/0272726 A1 | 9/2014 | Chang |
| 2014/0273521 A1 | 9/2014 | Wu et al. |
| 2014/0326408 A1* | 11/2014 | Sun ............... H01L 21/0337 156/345.3 |
| 2016/0343588 A1* | 11/2016 | Somervell ............. G03F 7/0002 |
| 2017/0345648 A1* | 11/2017 | Liu ................... H01L 21/02304 |

\* cited by examiner

200

```
┌─────────────────────────────────────┐
│  PATTERN A SUBSTRATE TO INCLUDE A   │
│       PLURALITY OF FEATURES         │
│                202                  │
└─────────────────────────────────────┘
                  │
                  ▼
┌─────────────────────────────────────┐
│  DEPOSIT A PRIMING MATERIAL OVER    │
│      THE PLURALITY OF FEATURES      │
│                204                  │
└─────────────────────────────────────┘
                  │
                  ▼
┌─────────────────────────────────────┐
│          FORM A LAYER OVER          │
│         THE PRIMING MATERIAL        │
│                206                  │
└─────────────────────────────────────┘
```

FIG. 2

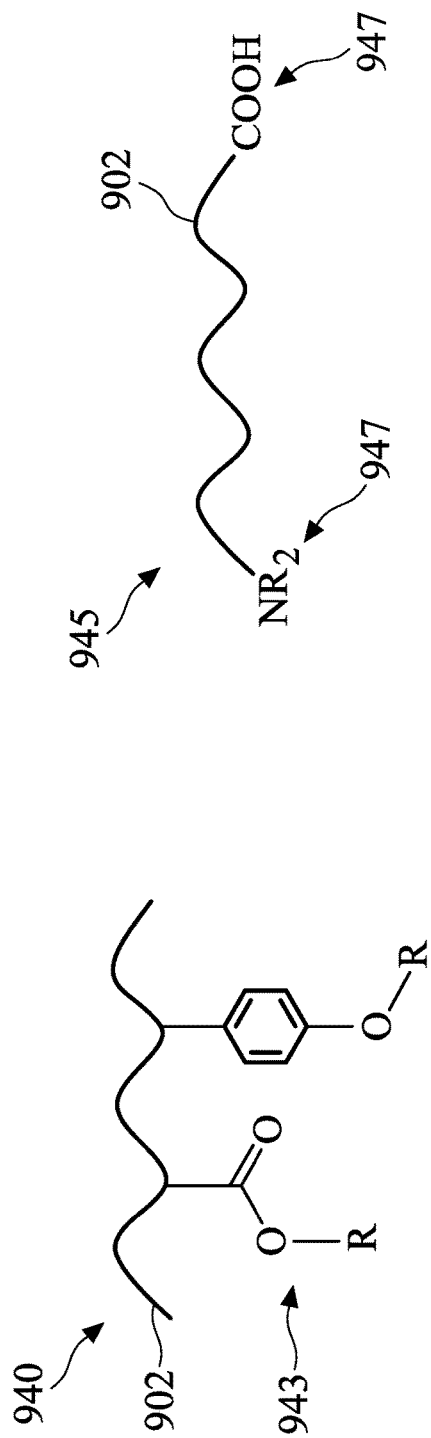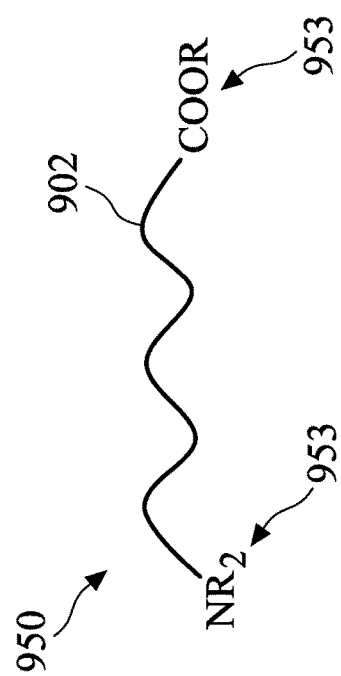
FIG. 9I
FIG. 9J
FIG. 9K

MATERIAL COMPOSITION AND PROCESS FOR SUBSTRATE MODIFICATION

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, scaling down of IC dimensions has been achieved by adoption of thinner photoresist films combined with a multilevel hardmask stack. For example, use of such a multilevel hardmask can be used to provide a desired aspect ratio at a desired resolution as part of a photolithography process. In various cases, the multilevel hardmask may include a carbon underlayer such as a spin-on-carbon (SOC) layer, upon which a silicon hardmask such as a spin-on-glass (SOG) layer may be deposited. A thin photoresist layer deposited on the silicon hardmask can be used to pattern the silicon hardmask (e.g., by an exposure, development, and etching process) Thereafter, the patterned silicon hardmask may be used to pattern the underlying SOC layer (e.g., by an etching process).

In various examples, however, deposition uniformity of the multilevel hardmask (e.g., SOC, SOG) is strongly related to the character of the substrate upon which it is being deposited. Moreover, advanced semiconductor processing technology employs a diverse array of processes and structures during a given manufacturing process. As such, at any given time during the semiconductor manufacturing process, a substrate surface may include any of a variety of material types (e.g., hydrophobic, hydrophilic, inert) and/or complex structures (e.g., 3-D FinFET structures, etc.) that exhibit distinct surface characteristics. Therefore, layers (e.g., SOC, SOG) spin-coated onto such diverse substrates may exhibit poor uniformity and poor planarization. Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIG. 2 shows a flowchart of a method 200 for substrate modification, according to various embodiments;

FIGS. 9A, 9B, 9C, 9D, 9E, 9F, 9G, 9H, 9I, 9J and 9K illustrate various embodiments of the structure of the priming material and the chelating functional groups.

DETAILED DESCRIPTION

Figure 1A:
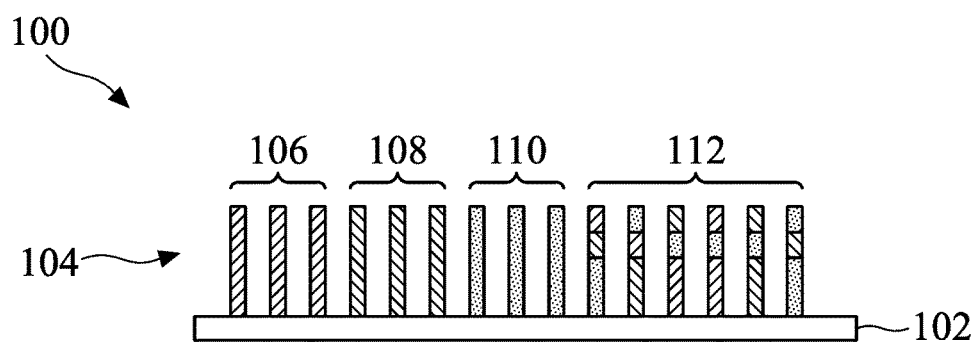
FIG. 1A illustrates a substrate having a plurality of features that provide a surface with an array of diverse characteristics.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to a substrate modification method and material composition that effectively overcomes the shortcomings of existing methods in which layers (e.g., SOC, SOG) that are spin-coated onto substrates with diverse characteristics (e.g., hydrophobic, hydrophilic, inert, etc.) exhibit poor uniformity and poor planarization. By way of example, embodiments disclosed herein provide for excellent planarization of spin-coated layers (e.g., such as SOC, SOG, etc.), regardless of the characteristics of a substrate surface onto which such a layer is deposited. This is achieved, in various embodiments, by use of a priming material layer that is deposited prior to deposition of other layers such as the SOC or SOG layer. As described in more detail below, the priming layer provides for a contiguous substrate surface having substantially uniform characteristics (e.g., similarly uniform attractive surface forces across the substrate and the plurality of features), thereby allowing subsequent layers (e.g., SOC, SOG) to be deposited with excellent uniformity and planarity. Moreover, in various embodiments, the priming material and related methods described herein may serve to recover depth of focus (DoF), contrast, and process window that would otherwise have been lost due to the undesirable non-uniformity of the deposited layer(s). As used herein, the term "process window" is used to define a region of focus and exposure (intensity) which provides for a final image patterned into a resist layer that meets defined specifications (e.g., for a given technology node, for a given toolset, etc.).

Figure 1B:
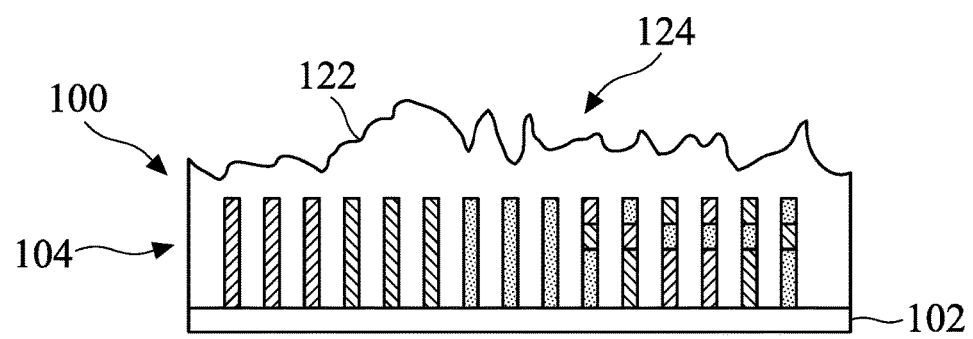
FIG. 1B illustrates a layer formed over the plurality of features, the layer having poor uniformity and poor planarization.

Referring first to the examples of FIGS. 1A and 1B, illustrated therein is a depiction of the challenges associated with at least some existing processes, described above. Specifically, FIG. 1A shows a device 100 including a substrate 102 having a plurality of features 104 formed onto the substrate 102. In various examples, the features 104 may correspond to metal layers, oxide layers, nitride layers, semiconductor layers, or other layers that makes up a component of a fabricated IC device. In some examples, features 104 may be combined with other features to form various portions of an IC device and/or circuit. In some embodiments, the features 104 may include various features known in the art which may be formed and/or deposited on the substrate 102. By way of example, a first subset 106 of the features 104 may include hydrophilic features (e.g., having a low contact angle, for example, less than around 90°). For instance, the first subset 106 may include features composed of materials such as $SiO_x$, SiN, SiON, or other hydrophilic features. In some cases, a second subset 108 of the features 104 may include hydrophobic features (e.g., having a high contact angle, for example, greater than around 90°). For instance, the second subset 108 may include features composed of materials such as TiN, $TiO_x$, TiON, SiOC, or other hydrophobic features. In some examples, a third subset 110 of the features 104 may include substantially inert features (e.g., exhibiting little interaction forces). For instance, the third subset 110 may include features composed of materials such as metals, TiN, or other substantially inert features. In some embodiments, a fourth subset 112 of the features 104 may include complex features such as, for example, fin structures used in the formation of fin field-effect transistors (FinFETs). For instance, in some examples, the fourth subset 112 may include various combinations of hydrophilic features, hydrophobic features, and substantially inert features. Therefore, as a group, the features 104 provide a substrate 102 surface with an array of diverse characteristics.

Referring to the example of FIG. 1B, a carbon underlayer 122 is formed (e.g., by spin-coating) on the substrate 102 and over the features 104. In some cases, the carbon underlayer 122 is part of a multilevel hardmask, which may be conventionally used to provide a desired aspect ratio at a desired resolution as part of a photolithography process. For example, the carbon underlayer 122 may include a spin-on-carbon (SOC) layer, upon which a silicon hardmask such as a spin-on-glass (SOG) layer may be deposited. In some embodiments, a thin photoresist layer deposited on the silicon hardmask may be used to pattern the silicon hardmask (e.g., by an exposure, development, and etching process). Thereafter, in some cases, the patterned silicon hardmask may be used to pattern the carbon underlayer 122. As shown in FIG. 1B, however, a surface 124 of the carbon underlayer 122 exhibits poor uniformity and poor planarization. Such poor uniformity and poor planarization may be directly attributed to the features 104, which present a diverse array of substrate 102 surface characteristics. For instance, in some cases, the carbon underlayer 122 may interact differently with surfaces of each of the subsets 106, 108, 110, 112 of the features 104, for example during the spin-coating deposition, resulting in the surface 124. As a result of the non-uniform and non-planar carbon underlayer 122, a photolithography process associated with the carbon underlayer 122 may suffer. For example, optical constants (e.g., 'n' and 'k' may be difficult to control), depth of focus (DoF) may suffer, patterned features may not maintain their fidelity, a desired aspect ratio may not be achieved, and other issues may arise due to the uneven topography and poor layer uniformity of the carbon underlayer 122. Moreover, in some cases, poor uniformity and poor planarization may also be evident in layers deposited on top of the carbon underlayer 122 (e.g., an SOG layer, a photoresist layer). Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include material compositions and methods for substrate modification of substrates having diverse surface characteristics (e.g., hydrophobic, hydrophilic, inert, etc.) prior to deposition of a subsequent layer (e.g., spin-coating of an SOC, SOG, and/or photoresist layer). For example, embodiments disclosed herein provide for excellent planarization of spin-coated layers, regardless of the characteristics of a substrate surface onto which such a layer is deposited. This is achieved, in various embodiments, by use of a priming material layer that is deposited prior to deposition of other layers such as the SOC or SOG layer. In various embodiments, the priming layer provides for a contiguous substrate surface having substantially uniform characteristics (e.g., similarly uniform attractive surface forces across the substrate and the plurality of features), thereby allowing subsequent layers (e.g., SOC, SOG) to be deposited with excellent uniformity and planarity. Moreover, in various embodiments, the priming material and related methods described herein may serve to recover depth of focus (DoF), contrast, and process window that would otherwise have been lost due to the undesirable non-uniformity of the surface characteristics of the deposited layer(s). In addition, at least some embodiments of the present disclosure may be simultaneously used to ameliorate gap fill impact (e.g., because of the strong interaction between the priming material and a substrate surface). As used herein, the term "gap fill impact" may be used to describe the challenge of gate metal fill (e.g., in a replacement metal gate process), trench dielectric fill, or other type of fill. In some existing processes, poor material fill (e.g., metal or dielectric material) may cause gaps or voids (e.g., in a metal gate, in a trench, or elsewhere), thereby detrimentally impacting device performance. Other embodiments and advantages will be evident to those skilled in the art upon reading the present disclosure.

In addition, it is noted that the material compositions and methods of the present disclosure are not limited to a particular substrate type, mask type, photoresist type, radiation source (e.g., radiation wavelength), and/or photolithography system type. For example, the material compositions and methods may be applied to features and/or devices patterned on a variety of substrate materials such as silicon, germanium, silicon carbide (SiC), silicon germanium (SiGe), diamond, compound semiconductors, alloy semiconductors, and the substrate may optionally include one or more epitaxial layers (epi-layers), may be strained for performance enhancement, may include a silicon-on-insulator (SOI) structure, and/or have other suitable enhancement features. Embodiments of the present disclosure may further be applicable to processes employing reflective masks (e.g., such as used for extreme ultraviolet (EUV) lithography), transmissive masks, binary intensity masks, phase-shifting masks, as well as other mask types known in the art. In some examples, embodiments disclosed herein may be applied to processes employing various types of photoresist such as poly(methyl methacrylate) (PMMA), SU-8, an EUV resist, a positive-tone resist, a negative-tone resist, or other types of resist as known in the art. Additionally, embodiments of the present disclosure are applicable to various photolithography system/aligner types such as a contact aligner, a proximity aligner, a projection aligner, or an EUV lithography system. Thus, embodiments of the present disclosure may further be applicable to systems employing any of a variety of radiation sources (radiation wavelengths) such as UV light, deep UV (DUV) light, EUV light, or other radiation sources as known in the art.

Referring now to the example of FIG. 2, illustrated therein is a flow chart of a method 200 for substrate modification, according to various embodiments. It is understood that additional operations can be provided before, during, and after the method 200, and some operations described can be replaced, eliminated, or moved around for additional embodiments of the method. It is also noted that the method 200 is exemplary, and is not intended to limit the present disclosure beyond what is explicitly recited in the claims that follow. The method 200 will be further described below in conjunction with FIGS. 3A, 3B, and 3C.

The method 200 begins at block 202 where a substrate is patterned to include a plurality of features having an array of diverse (e.g., distinct) characteristics. With reference to the example of FIG. 3A, in an embodiment of block 202, illustrated therein is a cross-section view of a device 300 including a substrate 302 having a plurality of features 304 formed onto the substrate 302. In some embodiments, the substrate 302 may be substantially similar to the substrate 102, described with reference to FIG. 1A. As such, the substrate 302 may likewise include one or more of a plurality of substrate materials (e.g., Si, Ge, SiC, SiGe, compound semiconductors, etc.), may include one or more epi-layers, may include conductive or insulating layers formed on the substrate 302, and/or may include various enhancement features, as previously described. The substrate 302 may also include various doping configurations depending on design requirements as is known in the art.

Figure 3A:
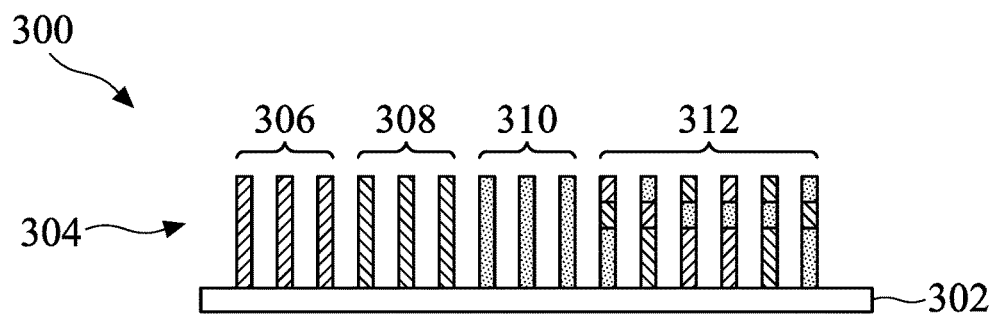
FIG. 3A illustrates a cross-section view of a device including a substrate having a plurality of features formed onto the substrate, in accordance with some embodiments.
Figure 3B:
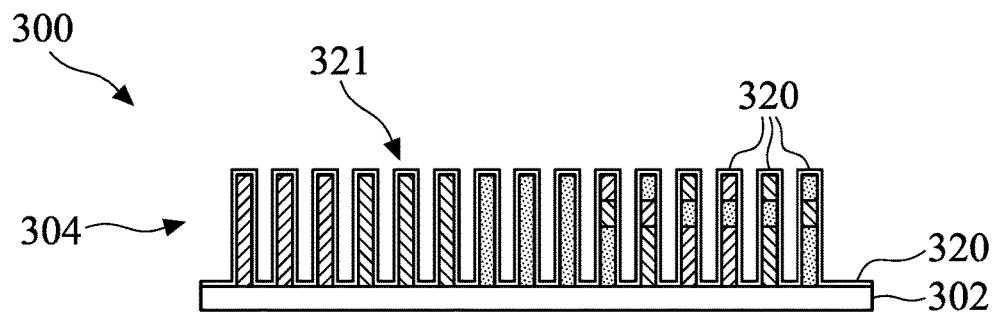
FIG. 3B illustrates a cross-section view of a device including a priming material deposited on the plurality of features, in accordance with some embodiments.
Figure 3C:
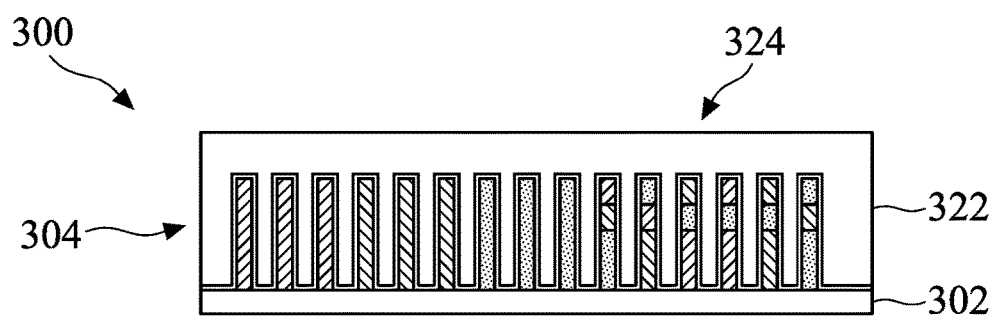
FIG. 3C illustrates a cross-section view of a device including layer deposited on the plurality of features with the priming material disposed therebetween, in accordance with some embodiments.

Additionally, in various embodiments, the features 304 of FIG. 3A may be substantially similar to the features 104 of FIG. 1A. Thus, in some examples, the features 304 may likewise correspond to metal layers, oxide layers, nitride layers, semiconductor layers, or other layers that makes up a component of a fabricated IC device and/or circuit. For instance, in some embodiments, a first subset 306 of the features 304 may include hydrophilic features (e.g., having a low contact angle, for example, less than around 90°). For example, the first subset 306 may include features composed of materials such as $SiO_x$, SiN, SiON, or other hydrophilic features. Thus, the hydrophilic features may include one or more hydrophilic surfaces. In some embodiments, a second subset 308 of the features 304 may include hydrophobic features (e.g., having a high contact angle, for example, greater than around 90°). Thus, in some cases, the second subset 308 may include features composed of materials such as TiN, $TiO_x$, TiON, SiOC, or other hydrophobic features. Thus, the hydrophobic features may include one or more hydrophobic surfaces. In some embodiments, a third subset 310 of the features 304 may include substantially inert features (e.g., exhibiting little interaction forces). Thus, in some examples, the third subset 310 may include features composed of materials such as metals, TiN, or other substantially inert features. Thus, the substantially inert features may include one or more substantially inert surfaces. In some embodiments, a fourth subset 312 of the features 304 may include complex features such as, for example, fin structures used in the formation of fin field-effect transistors (FinFETs). Thus, in some examples, the fourth subset 312 may include various combinations of hydrophilic features, hydrophobic features, and substantially inert features having various combinations of hydrophilic surfaces, hydrophobic surfaces, and substantially inert surfaces. Generally, and in some embodiments, each of the subsets 306, 308, 310, 312 of the features 304 may include features composed of materials described by a chemical formula '$MX_b$', where 'M' is a metal or silicon (Si), 'X' is nitrogen (N) or oxygen (O), and 'b' is equal to about 0.4 to about 2.5. Thus, in addition to the materials mentioned above for each of the subsets, one or more of the subsets 306, 308, 310, 312 may include other materials such as $SiO_2$, SiN, aluminum oxide, hafnium oxide, lanthanum oxide, as well as other materials described by the chemical formula '$MX_b$'. Therefore, the features 304 as a group, like the features 104, provide a substrate 302 surface with an array of distinct surface characteristics (e.g., different surface types and/or different surface characteristics).

The method 200 proceeds to block 204 where a priming material is deposited over the plurality of features. With reference to the example of FIGS. 3A and 3B, in an embodiment of block 204, illustrated therein is a cross-section view of the device 300 including a priming material 320 deposited on the substrate 302 and over the plurality of features 304, In particular, the priming material 320 may be deposited over each of the first subset 306, the second subset 308, the third subset 310, and the fourth subset 312. Thus, after deposition of the priming material 320, the features 304, as a group, may provide a substrate surface 321 with a uniform set of surface characteristics. As such, embodiments of the present disclosure provide a substrate surface having substantially uniform characteristics, thereby allowing subsequent layers (e.g., SOC, SOG) to be deposited with excellent uniformity and planarity.

In various embodiments, the priming material 320 may include a chelating material (e.g., a multidentate ligand), as described in more detail below with reference to FIGS. 7, 8, and 9A-9K. In various examples, the priming material 320 exhibits a strong interaction with the substrate 302 and/or with the features 304, such that the coating of the features 304 by the priming material is uniform and stable. In some embodiments, the priming material 320 may be deposited by a spin-coating process, by vapor deposition, or by another suitable deposition method. In at least some examples, the priming material 320 may be conformally deposited over the device 300. For example, in some cases, the deposited priming material 320 may conform at least partially to a surface profile of the device 300 (e.g., including the features 304 and the exposed substrate 302). Additional details regarding the priming material 320 deposition are discussed below with reference to FIGS. 4A, 4B, 5A, 5B, 5C, 5D, 6A, and 6B.

The method 200 proceeds to block 206 where a layer is formed over the priming material. With reference to the example of FIGS. 3B and 3C, in an embodiment of block 206, illustrated therein is a cross-section view of the device 300 including a carbon underlayer 322 formed on the substrate 302 and over the features 304. In particular, the carbon underlayer 322 is formed over, and in contact with, the priming material 320 deposited at block 204. In some embodiments, the carbon underlayer 322 is substantially the same as the carbon underlayer 122 discussed above with reference to FIG. 1B. As such, the carbon underlayer 322 may likewise be part of a multilevel hardmask, used as part of a photolithography process. In some embodiments, the carbon underlayer 322 includes an SOC layer, upon which a silicon hardmask such as an SOG layer is deposited. In some cases, a thin photoresist layer deposited on the silicon hardmask may be used to pattern the silicon hardmask (e.g., by an exposure, development, and etching process). Thereafter, in some cases, the patterned silicon hardmask may be used to pattern the carbon underlayer 322. Contrary to at least some existing process (e.g., as shown in FIG. 1B), a surface 324 of the carbon underlayer 322 exhibits excellent uniformity and excellent planarization. Such excellent uniformity and planarization may be directly attributed to the priming material 320 deposited on the features 304, prior to deposition of the carbon underlayer 322, where the priming material 320 provides uniform surface characteristics for the substrate 302. For instance, in various embodiments and because of the priming material 320, the deposited carbon underlayer 322 may interact similarly (e.g., with a similarly attractive interaction force) with surfaces of each of the subsets 306, 308, 310, 312 of the features 304, for example during the spin-coating deposition, resulting in the surface 324. Thus, use of the priming material 320 may serve to recover depth of focus (DoF), contrast, and process window that would otherwise have been lost due to the undesirable non-uniformity of the surface characteristics of the deposited layer(s). In addition, and in at least some embodiments, the priming material 320 may be simultaneously used to ameliorate gap fill impact, as described above. Moreover, while embodiments described herein include a carbon underlayer deposited over the priming material, it will be understood that the priming material may be used in other circumstances where substrate modification (e.g., to provide a substrate surface having uniform characteristics) is desired. As such, in some embodiments, other materials and/or layers (e.g., apart from a carbon underlayer) may be deposited over a priming material, while remaining within the scope of the present disclosure.

Figure 4B:
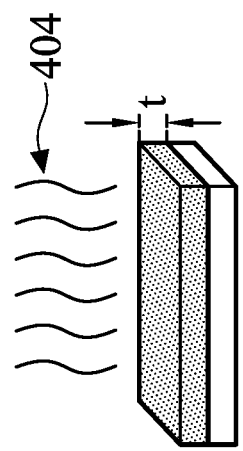
FIGS. 4A and 4B illustrate a first deposition method for coating the substrate and the features with the priming material, in accordance with some embodiments.
Figure 4A:
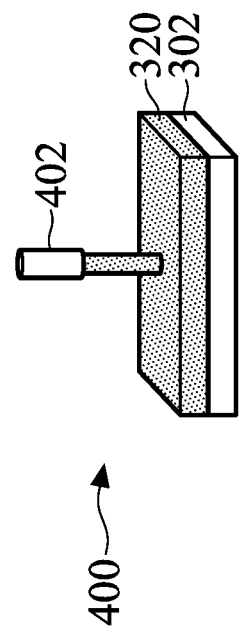
Figure 5A:
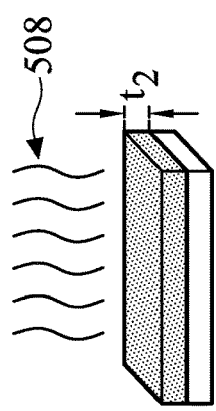
FIGS. 5A, 5B, 5C and 5D illustrate a second deposition method for coating the substrate and the features with the priming material, in accordance with some embodiments.
Figure 5B:
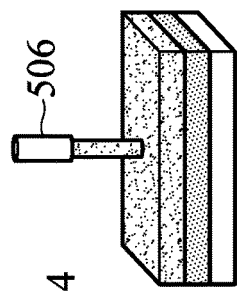
Figure 5C:
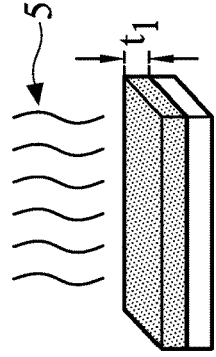
Figure 5D:
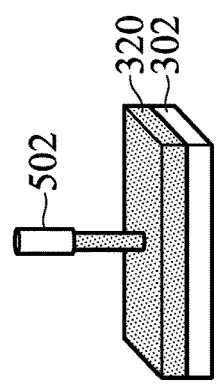

In an embodiment of block 204 of the method 200, and with reference to FIGS. 4A, 4B, 5A, 5B, 5C, 5D, 6A, and 6B, illustrated therein are at least some examples of methods by which the priming material 320 may be deposited. Referring first to the example of FIGS. 4A and 4B, illustrated therein is a deposition method 400 for coating the substrate 302 and the features 304 with the priming material 320. By way of example, the deposition method 400 includes a spin-coating process where the priming material 320 is dispensed (e.g., via a nozzle 402, shown in FIG. 4A) onto the substrate 302 (e.g., while the substrate 302 is not moving, or while the substrate is spinning at a low rate of speed). After dispensing the priming material 320, the substrate 302 is rotated at a high rate of speed, where a rotation speed and a rotation time may be selected based on a desired final thickness 't' of the priming material 320 on the substrate 302. Afterwards, and in some embodiments, a baking process 404 (FIG. 4B) may be performed to remove solvents from the spun-on priming material 320. In some embodiments, the thickness 't' of the priming material 320 deposited by the method 400 less than about 10 nm.

Referring to the example of FIGS. 5A, 5B, 5C and 5D, illustrated therein is an alternative deposition method 500 for coating the substrate 302 and the features 304 with the priming material 320. By way of example, the deposition method 500 also includes a spin-coating process where the priming material 320 is dispensed (e.g., via a nozzle 502, shown in FIG. 5A) onto the substrate 302 and the substrate 302 is rotated at a high rate of speed, resulting in a first thickness '$t_1$' of the priming material 320 on the substrate 302. Afterwards, and in some embodiments, a first baking process 504 (FIG. 5B) may be performed to remove solvents from the spun-on priming material 320. In some embodiments, the thickness '$t_1$' of the priming material 320 deposited by the method 400 greater than about 10 nm. Moreover, in some cases, the thickness '$t_1$' may be determined to be too thick. Thus, in some embodiments, a rinsing process (e.g., using de-ionized (DI) water or a solvent) may be performed, where water or an appropriate solvent is dispensed (e.g., via a nozzle 506, shown in FIG. 5C) onto the priming material 320 previously deposited onto the substrate 302. In various cases, the rinsing process may be performed while the substrate 302 is rotated or while the substrate is not moving. By way of example, the priming material 320 may be at least partially soluble in water or a solvent, resulting in a reduction in the thickness of the priming material 320 due to the rinsing process. For instance, after the rinsing process the priming material 320 may have a second thickness '$t_2$', where the second thickness '$t_2$' is less than the first thickness '$t_1$'. In some embodiments, the second thickness '$t_2$' is less than about 10 nm. Thereafter, in some embodiments, a second baking process 508 (FIG. 5D) may be performed to remove the water that was introduced during the rinsing process. In some embodiments, and in addition to thinning the priming material 320, the rinsing process of the deposition method 500 may assist in providing a more uniform priming material 320. In at least some embodiments, the thinning of the priming material 320 described above may be desirable, for example, to simplify the later removal of the priming material 320.

Figure 6B:
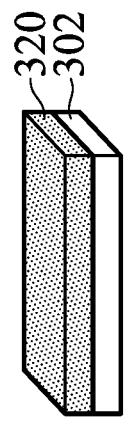
FIGS. 6A and 6B illustrate a third deposition method for coating the substrate and the features with the priming material, in accordance with some embodiments.
Figure 6A:
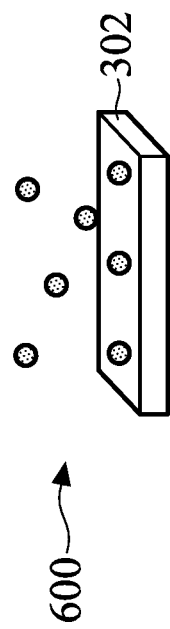

With reference to the example of FIGS. 6A and 6B, illustrated therein is a deposition method 600 for coating the substrate 302 and the features 304 with the priming material 320. By way of example, the deposition method 600 includes a vapor deposition process where the priming material 320 is dispensed in a vapor phase (FIG. 6A) onto the substrate 302. In some embodiments, process parameters of the vapor deposition process may be selected to provide a desired final thickness 't' of the priming material 320 on the substrate 302. In some cases, the vapor deposition process is performed at an elevated temperature (e.g., greater than room temperature), such that solvents and/or other moisture (e.g., water) may be removed from the priming material 320 and/or substrate 302 surface simultaneous with deposition of the priming material 320. In some embodiments, the thickness 't' of the priming material 320 deposited by the method 600 is less than about 10 nm.

Figure 7:
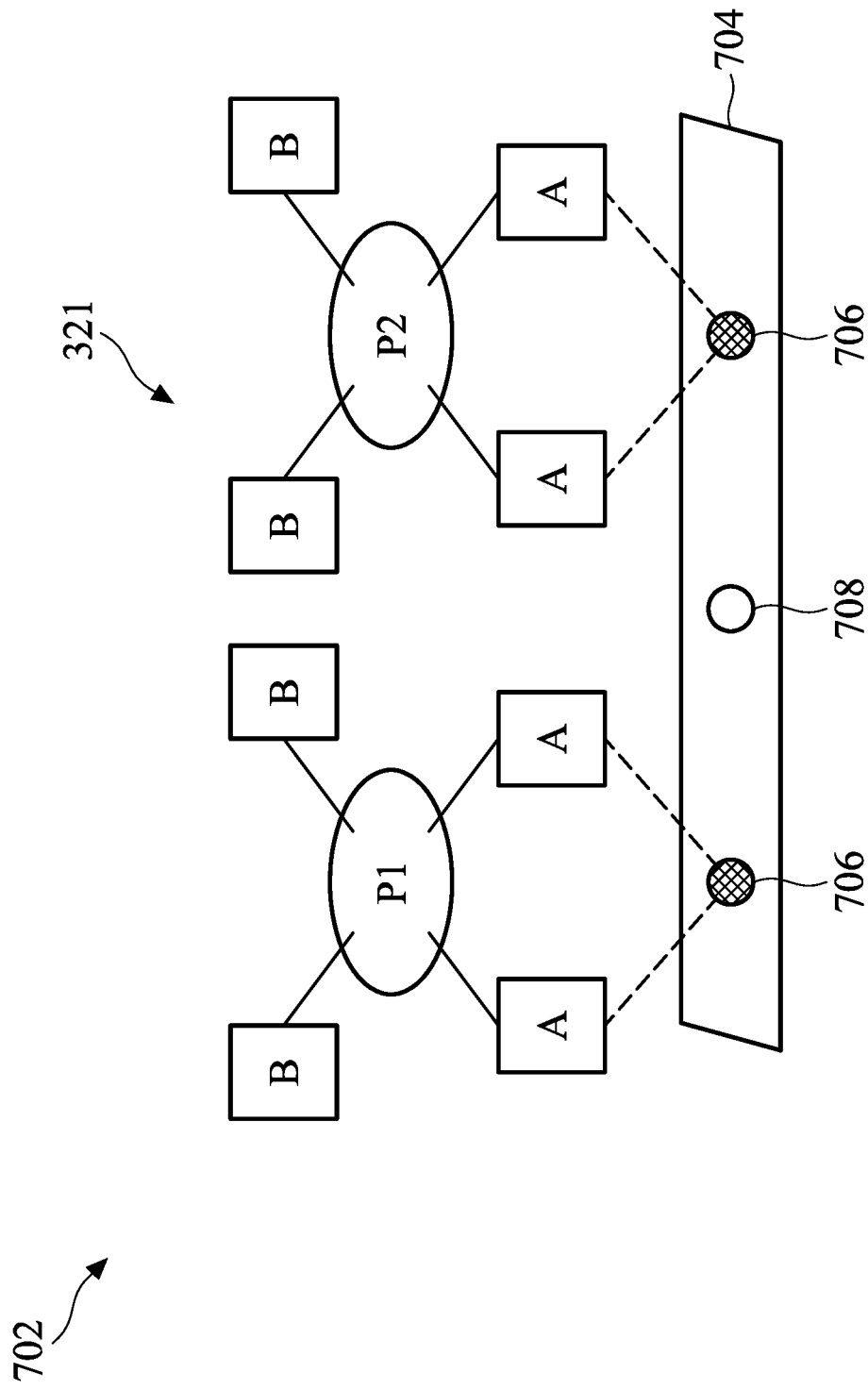
FIG. 7 illustrates a more detailed view of an embodiment of a priming material deposited onto a surface, the priming material including a plurality of monomers or oligomers, in accordance with some embodiments.

Referring now to the example of FIG. 7, illustrated therein is a more detailed view of an embodiment of a priming material (e.g., the priming material 320) deposited onto a surface (e.g., a substrate 302 surface and/or a surface of the features 304). In particular, FIG. 7 schematically shows a priming material 702 in contact with, and bonded to, a layer 704. In some examples, the priming material 702 may include a plurality of monomers (or oligomers) in contact with, and bonded to, the layer 704. In some cases, such monomers (or oligomers) may have a low molecular weight (e.g., MW less than about 800). In some embodiments, the layer 704 includes a portion of a substrate such as the substrate 302. In some cases, the layer 704 may include a portion of the first subset 306, the second subset 308, the third subset 310, or the fourth subset 312 of the features 304. As such, in various embodiments, the layer 704 may include one or more materials and/or structures of the first, second, third, and/or fourth subsets of the features 304 as described above such as $SiO_x$, SiN, SiON, TiN, $TiO_x$, TiON, SiOC, as well as other hydrophobic materials, hydrophilic materials, metals, complex fin structures, or a combination thereof. Merely for purposes of discussion, the layer 704 of FIG. 7 may include a metal-containing layer (e.g., such as TiN) having one or more metal atoms 706 and one or more nitrogen atoms 708. In general, and in some embodiments, the layer 704 may be described as a layer that is substantially inert (e.g., exhibiting little interaction forces with a coating material). Thus, in various examples, the priming material 702 provides for substrate modification, for example from the substantially inert surface to a substrate surface 321 with a greater interaction with a subsequently deposited coating material (e.g., such as a subsequently deposited SOC layer). In at least some embodiments, the phrase "substrate modification" may be used to describe modification of the exposed surface type (e.g., inert to attractive) prior to deposition of the subsequently deposited coating material (e.g., SOC layer).

As previously discussed, and in various embodiments, the priming material 702 includes a chelating material (e.g., a multidentate ligand). As used herein, a "chelating material" may be used to describe a material (e.g., the priming material 702) that effectively interacts with and/or bonds to a metal-containing material and/or other substantially inert material, as described above. In the example of FIG. 7, and in some embodiments, 'P1' and 'P2' may each include a C1-C20 saturated or unsaturated hydrocarbon ring. In some cases, 'P1' and 'P2' may each include a C2-C20 heterocyclic group including a chain, a ring, or 3D structure. Moreover, in various embodiments and still with reference to FIG. 7, functional groups 'A' and 'B' may be bonded to 'P1' and 'P2'. In addition, in various embodiments, functional groups 'A' and 'B' may include chelating functional groups (e.g., exhibiting a strong chelating effect), thereby each of 'A' and 'B' will have a strong interaction with metal (e.g., such as the metal atoms 706, shown bonded to chelating functional group 'A'). In some embodiments, the chelating functional group 'B' bonds to the subsequent layer (e.g., an SOC layer). In some embodiments, 'A' and 'B' include the same functional group. Alternatively, in some embodiments, 'A' and 'B' include different functional groups. By way of example, the 'A' and 'B' chelating functional groups may each include at least one of CO, CN—, $C_6H_5$—, $NO_2$, phenol, amine, pyridine, bi-pyridine, OCCO, $NH_3$, —OH, and COOH. In some embodiments, the priming material 702 may also include one or more of an acid labile group, a photoacid generator, and a dissolution inhibitor. In some embodiments, each of 'A' and 'B' may undergo a polarity switch upon appropriate activation such as for example, an acidic condition, a basic condition, a UV curing condition, and/or a thermal treatment condition. In particular, in some embodiments, each of 'A' and 'B' may include at least one of the chelating functional groups after undergoing the polarity switch. As merely one example, functional groups 'A' and/or 'B' may initially include an ester before polarity switch, and may include carboxylic acid and a leaving group after the polarity switch. As another example, functional groups 'A' and/or 'B' may initially include phenolate alkyl before the polarity switch, and may include phenol and a leaving group after the polarity switch. In various embodiments, after depositing the priming material 702, and in some cases after the polarity switch, a subsequent layer (e.g., an SOC layer) may be formed on the priming layer 702. As discussed above, the subsequent layer will have excellent uniformity and planarization, due to the substrate modification provided by the priming material 702.

Figure 8:
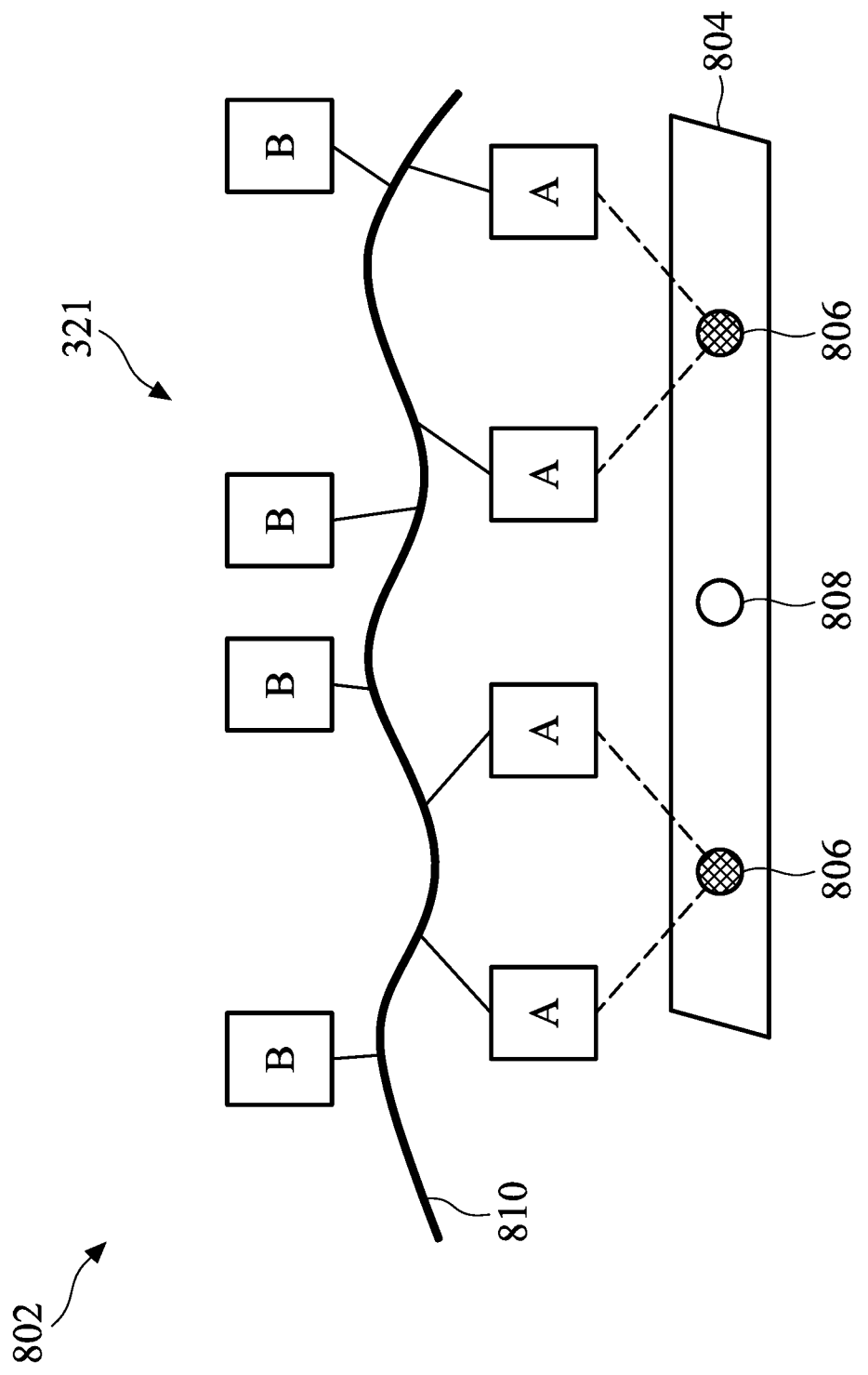
FIG. 8 illustrates a more detailed view of an embodiment of a priming material deposited onto a surface, the priming material including a polymer, in accordance with some embodiments.

With reference to the example of FIG. 8, illustrated therein is a more detailed view of an embodiment of a priming material (e.g., the priming material 320) deposited onto a surface (e.g., a substrate 302 surface and/or a surface of the features 304). In particular, FIG. 8 schematically shows a priming material 802 in contact with, and bonded to, a layer 804. In some embodiments, the layer 804 may be substantially the same as the layer 704 discussed above with reference to FIG. 7. In some examples, the priming material 802 may include a polymer (e.g., a single polymer, multi-polymer blend, or monomer-polymer blend) in contact with, and bonded to, the layer 804. In some cases, the polymer may have a high molecular weight (e.g., MW greater than about 800). Merely for purposes of discussion, the layer 804 of FIG. 8 may include a metal-containing layer (e.g., such as TiN) having one or more metal atoms 806 and one or more nitrogen atoms 808. As in embodiments discussed above, the priming material 802 provides for substrate modification, for example from the substantially inert surface to a substrate surface 321 with a greater interaction with a subsequently deposited coating material (e.g., such as a subsequently deposited SOC layer).

In various embodiments, the priming material 802 includes a chelating material (e.g., a multidentate ligand). In the example of FIG. 8, and in some embodiments, the priming material 802 may include a polymer backbone 810, to which each of a plurality of chelating functional groups are bonded. In some embodiments, the polymer backbone 810 may include, for example, methyl acrylate, acrylate, polyethylene, polystyrene, a derivative thereof, or other appropriate polymer backbone. In some embodiments, the chelating functional groups 'A' and 'B' may be substantially the same as described above with reference to FIG. 7. For example, the chelating functional groups 'A' and 'B' will have a strong interaction with metal (e.g., such as the metal atoms 806, shown bonded to chelating functional group 'A'). In some embodiments, the chelating functional group 'B' bonds to the subsequent layer (e.g., an SOC layer). As described above, 'A' and 'B' may include the same functional group or different functional groups. In various embodiments, 'A' and 'B' chelating functional groups of the priming material 802 may each similarly include at least one of CO, CN—, $C_6H_5$—, $NO_2$, phenol, amine, pyridine, bi-pyridine, OCCO, $NH_3$, —OH, and COOH. In some embodiments, the priming material 802 may also include one or more of an acid labile group, a photoacid generator, and a dissolution inhibitor. In some embodiments, each of 'A' and 'B' may undergo a polarity switch upon appropriate activation such as for example, an acidic condition, a basic condition, a UV curing condition, and/or a thermal treatment condition. In particular, in some embodiments, each of 'A' and 'B' may include at least one of the chelating functional groups after undergoing the polarity switch. In various embodiments, after depositing the priming material 802, and in some cases after the polarity switch, a subsequent layer (e.g., an SOC layer) may be formed on the priming layer 802. As discussed above, the subsequent layer will have excellent uniformity and planarization, due to the substrate modification provided by the priming material 802.

Figure 9B:
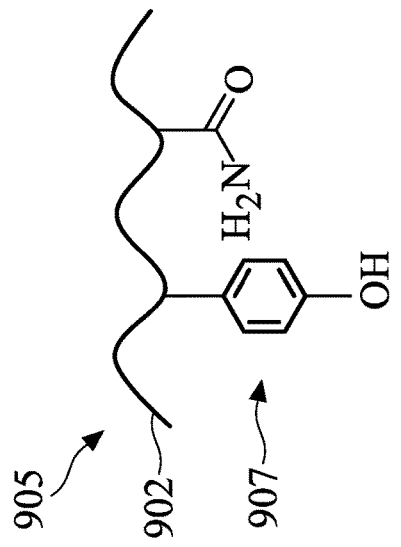
Figure 9D:
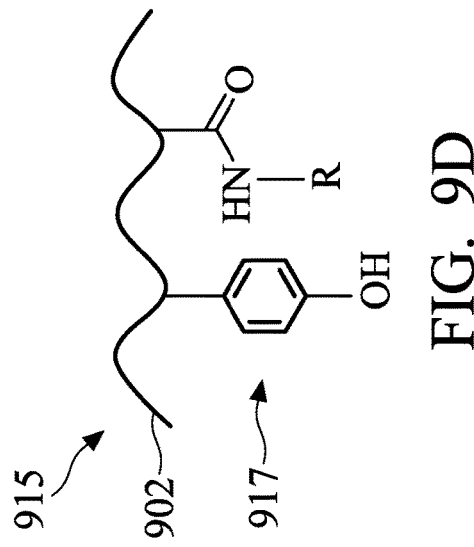
Figure 9A:
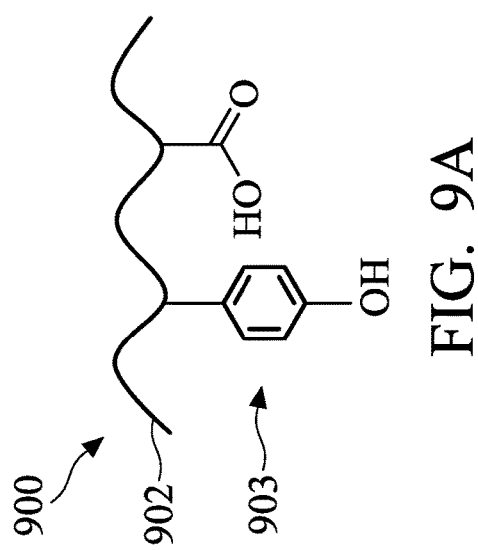
Figure 9C:
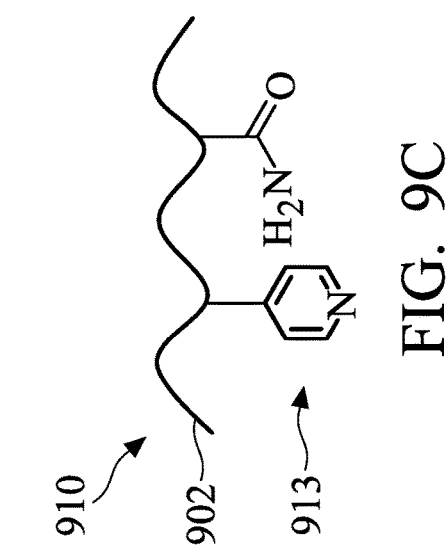
Figure 9E:
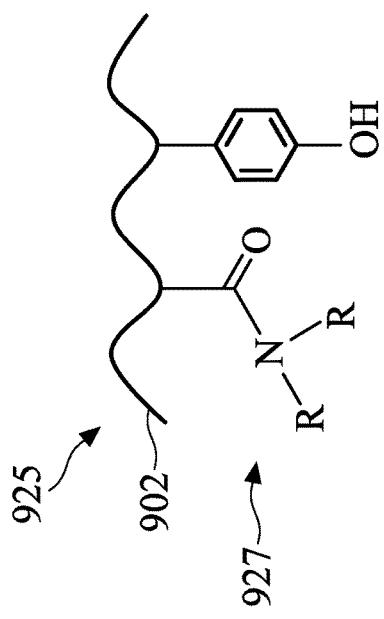
Figure 9F:
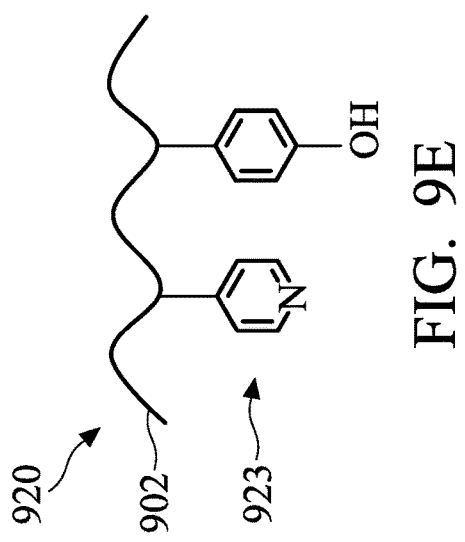
Figure 9G:
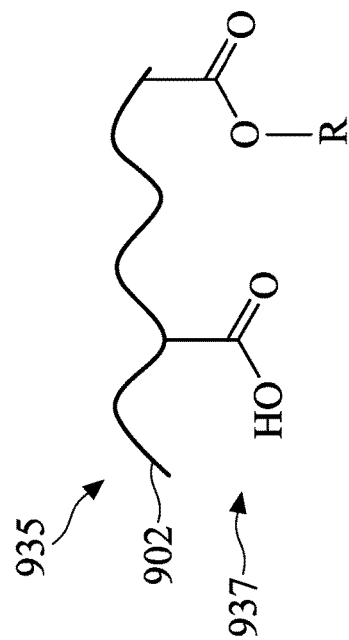
Figure 9H:
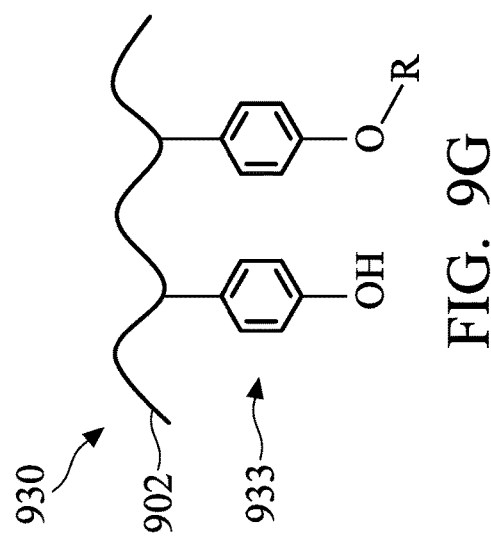

Expanding upon the structure of the priming material and the chelating functional groups, and with reference to FIGS. 9A-9K, example of various embodiments of a priming material structure are illustrated. In particular, FIG. 9A illustrates a priming material 900 including a polymer backbone 902 (e.g., which may be substantially the same as the polymer backbone 810) and chelating functional groups 903, where the chelating functional groups 903 include phenol and carboxylic acid. In some embodiments, the priming material may also include a nitrogen functional group. FIG. 9B illustrates a priming material 905 including the polymer backbone 902 and chelating functional groups 907, where the chelating functional groups 907 include phenol and an amine group. FIG. 9C illustrates a priming material 910 including the polymer backbone 902 and chelating functional groups 913, where the chelating functional groups 913 include pyridine and an amine group. FIG. 9D illustrates a priming material 915 including the polymer backbone 902 and chelating functional groups 917, where the chelating functional groups 917 include phenol and an amine group. FIG. 9E illustrates a priming material 920 including the polymer backbone 902 and chelating functional groups 923, where the chelating functional groups 923 include pyridine and phenol. FIG. 9F illustrates a priming material 925 including the polymer backbone 902 and chelating functional groups 927, where the chelating functional groups 927 include an amide group and phenol. FIG. 9G illustrates a priming material 930 including the polymer backbone 902 and chelating functional groups 933, where the chelating functional groups 933 include phenol and phenolate. FIG. 9H illustrates a priming material 935 including the polymer backbone 902 and chelating functional groups 937, where the chelating functional groups 937 include carboxylic acid. FIG. 9I illustrates a priming material 940 including the polymer backbone 902 and chelating functional groups 943, where the chelating functional groups 943 include ester and phenolate alkyl. FIG. 9J illustrates a priming material 945 including the polymer backbone 902 and chelating functional groups 947, where the chelating functional groups 947 include $NR_2$ and COOH. FIG. 9K illustrates a priming material 950 including the polymer backbone 902 and chelating functional groups 953, where the chelating functional groups 953 include $NR_2$ and COOR. In some embodiments including 'R' groups, such as shown in the examples of FIGS. 9D, 9F, 9G, 9H, and 9I, the 'R' group may be cleaved for example, by exposure to an acidic condition, a basic condition, a UV curing condition, and/or a thermal treatment condition. While FIGS. 9A-9K provide some examples of priming material structures, it will be understood that other priming materials structures and other functional groups may be employed without departing from the scope of the present disclosure.

The embodiments of the present disclosure offer advantages over existing art, though it is understood that other embodiments may offer different advantages, not all advantages are necessarily discussed herein, and that no particular advantage is required for all embodiments. For example, embodiments discussed herein include material compositions and methods for substrate modification of substrates having diverse surface characteristics (e.g., hydrophobic, hydrophilic, inert, etc.) prior to deposition of a subsequent layer (e.g., spin-coating of an SOC, SOG, and/or photoresist layer). For example, embodiments disclosed herein provide for excellent planarization of spin-coated layers, regardless of the characteristics of a substrate surface onto which such a layer is deposited. This is achieved, in various embodiments, by use of a priming material layer that is deposited prior to deposition of other layers such as the SOC or SOG layer. In various embodiments, the priming layer provides for a substrate surface (e.g., along an exposed top surface of the priming layer) having substantially uniform characteristics (e.g., similarly uniform attractive surface forces across the substrate and the plurality of features), thereby allowing subsequent layers (e.g., SOC, SOG) to be deposited with excellent uniformity and planarity onto the exposed top surface of the deposited priming material. Moreover, in various embodiments, the priming material and related methods described herein may serve to recover depth of focus (DoF), contrast, and process window that would otherwise have been lost due to the undesirable non-uniformity of the surface characteristics of the deposited layer(s). In addition, at least some embodiments of the present disclosure may be simultaneously used to ameliorate gap fill impact because of the priming material's good gap fill performance, for example, due to the strong interaction between the priming material and a substrate surface). Those of skill in the art will readily appreciate that the methods described herein may be applied to a variety of other semiconductor structures, semiconductor devices, and semiconductor processes to advantageously achieve similar benefits to those described herein without departing from the scope of the present disclosure.

Thus, one of the embodiments of the present disclosure described a method including patterning a substrate to include a plurality of features. In some embodiments, the plurality of features includes a first subset of features having one or more substantially inert surfaces. In various embodiments, a priming material is deposited over the substrate, over the plurality of features, and over the one or more substantially inert surfaces. By way of example, the deposited priming material bonds at least to the one or more substantially inert surfaces. Additionally, in some embodiments, the deposited priming material provides a modified substrate surface. In some cases, after depositing the priming material, a layer is spin-coated over the modified substrate surface. In various embodiments, the spin-coated layer is substantially planar.

In another of the embodiments, discussed is a method including patterning a substrate to include a plurality of features including a first subset of features having a first surface and a second subset of features having a second surface. In some embodiments, the first surface has a first surface characteristic and the second surface has a second surface characteristic different than the first surface characteristic. In various examples, a chelating material is deposited over the substrate including over the first and second subsets of features. In some embodiments, the deposited chelating material bonds at least to the first and second surfaces to provide a primed substrate surface. In various embodiments, after depositing the chelating material, a spin-on-carbon (SOC) layer is deposited over the primed substrate surface, where the SOC layer is substantially planar.

In yet other embodiments, discussed is a method including patterning a set of features on a substrate, where the set of features include one or more surfaces having a first interaction force. In some embodiments, a priming material is deposited over the set of features, where the deposited priming material bonds at least to the one or more surfaces. Additionally, in some embodiments, a top surface of the deposited priming material provides a modified substrate surface having a second interaction force greater than the first interaction force. In some examples, after depositing the priming material, a layer is spin-coated onto the modified substrate surface, where the spin-coated layer bonds to the top surface of the deposited priming material. Moreover, the spin-coated layer is substantially planar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   patterning a substrate to include a plurality of features, wherein the plurality of features includes a first subset of features having one or more substantially inert surfaces;
   depositing a priming material over the substrate including over the plurality of features and over the one or more substantially inert surfaces, wherein the deposited priming material bonds at least to the one or more substantially inert surfaces, and wherein the deposited priming material provides a modified substrate surface; and
   after depositing the priming material, spin-coating a layer over the modified substrate surface, wherein the spin-coated layer is substantially planar.

2. The method of claim 1, wherein the plurality of features further includes a second subset of features having one or more hydrophilic surfaces; and
   wherein the depositing the priming material further includes depositing the priming material over the one or more hydrophilic surfaces, wherein the deposited priming material bonds to the one or more hydrophilic surfaces.

3. The method of claim 2, wherein the plurality of features further includes a third subset of features having one or more hydrophobic surfaces; and
   wherein the depositing the priming material further includes depositing the priming material over the one or more hydrophobic surfaces, wherein the deposited priming material bonds to the one or more hydrophobic surfaces.

4. The method of claim 1, wherein the first subset of features includes a metal layer, a nitride layer, or a combination thereof.

5. The method of claim 1, wherein the priming material includes a chelating functional group having at least one of CO, CN—, $C_6H_5$—, $NO_2$, phenol, amine, pyridine, bi-pyridine, OCCO, $NH_3$, —OH, and COOH.

6. The method of claim 1, wherein the spin-coated layer includes a spin-on-carbon (SOC) layer.

7. The method of claim 1, further comprising:
   after depositing the priming material and prior to spin-coating the layer over the modified substrate surface, activating the priming material by exposure to at least one of an acidic condition, a basic condition, a UV curing condition, and a thermal treatment condition.

8. The method of claim 1, wherein the deposited priming material includes a first functional group bonded to the one or more substantially inert surfaces, and wherein the deposited priming material includes a second functional group that provides the modified substrate surface.

9. The method of claim 8, further comprising:
   after depositing the priming material, spin-coating the layer over the modified substrate surface, wherein the spin-coated layer bonds to the second functional group.

10. The method of claim 9, wherein the first and second functional groups are the same.

11. The method of claim 9, wherein the first and second functional groups are different.

12. A method, comprising:
    patterning a substrate to include a plurality of features including a first subset of features having a first surface and a second subset of features having a second surface, wherein the first surface has a first surface characteristic and the second surface has a second surface characteristic different than the first surface characteristic;
    depositing a chelating material over the substrate including over the first and second subsets of features, wherein the deposited chelating material bonds at least to the first and second surfaces to provide a primed substrate surface; and
    after depositing the chelating material, depositing a spin-on-carbon (SOC) layer over the primed substrate surface, wherein the SOC layer is substantially planar.

13. The method of claim 12, further comprising:
    patterning the substrate to include the plurality of features including a third subset of features having a third surface, wherein the third surface has a third surface characteristics different than the first and second surface characteristics; and
    depositing the chelating material over the substrate including over the third subset of features, wherein the deposited chelating material further bonds at least to the third surface to provide the primed substrate surface.

14. The method of claim 13, wherein the first surface includes a substantially inert surface, wherein the second surface includes a hydrophilic surface, and wherein the third surface includes a hydrophobic surface.

15. The method of claim 12, further comprising:
    patterning the substrate to include the plurality of features including a third subset of features having a combination of the first and second surfaces.

16. The method of claim 12, wherein the chelating material includes a functional group having at least one of CO, CN—, $C_6H_5$—, $NO_2$, phenol, amine, pyridine, bi-pyridine, OCCO, $NH_3$, —OH, and COOH.

17. A method, comprising:
    patterning a set of features on a substrate, wherein the set of features include one or more surfaces having a first interaction force;

depositing a priming material over the set of features, wherein the deposited priming material bonds at least to the one or more surfaces, and wherein a top surface of the deposited priming material provides a modified substrate surface having a second interaction force greater than the first interaction force; and after depositing the priming material, spin-coating a layer onto the modified substrate surface, wherein the spin-coated layer bonds to the top surface of the deposited priming material, and wherein the spin-coated layer is substantially planar.

18. The method of claim 17, further comprising:

depositing the priming material over the set of features, wherein the deposited priming material has a first thickness;

after depositing the priming material and prior to spin-coating the layer onto the modified substrate surface, thinning the priming material, wherein the thinned priming material has a second thickness less than the first thickness.

19. The method of claim 17, wherein the set of features are composed of materials described by a chemical formula '$MX_b$', wherein 'M' is a metal or silicon (Si), 'X' is nitrogen (N) or oxygen (O), and 'b' is in a range from to about 0.4 to about 2.5.

20. The method of claim 17, wherein the priming material includes a chelating functional group having at least one of CO, CN—, $C_6H_5$—, $NO_2$, phenol, amine, pyridine, bi-pyridine, OCCO, $NH_3$, —OH, and COOH.

* * * * *